(12) United States Patent
Lee et al.

(10) Patent No.: US 7,276,668 B2
(45) Date of Patent: Oct. 2, 2007

(54) CIRCUIT BOARD WITH MOUNTING PADS FOR REDUCING PARASITIC EFFECT

(75) Inventors: Sheng-Yuan Lee, Hsin Tien (TW); Ya-Chi Liao, Hsin Tien (TW)

(73) Assignee: Via Technologies, Inc., Hsin Tien, Taipei Hsien (TW)

( * ) Notice: Subject to any disclaimer, the term of this patent is extended or adjusted under 35 U.S.C. 154(b) by 0 days.

(21) Appl. No.: 10/964,619

(22) Filed: Oct. 15, 2004

(65) Prior Publication Data

US 2005/0178582 A1 Aug. 18, 2005

(30) Foreign Application Priority Data

Feb. 17, 2004 (TW) .............................. 93103818 A

(51) Int. Cl.
 *H05K 1/03* (2006.01)
(52) U.S. Cl. ...................................... 174/255; 174/261
(58) Field of Classification Search ................ 174/255, 174/260, 261, 262; 361/760, 792, 793, 794, 361/795
See application file for complete search history.

(56) References Cited

U.S. PATENT DOCUMENTS

| 6,023,210 | A | * | 2/2000 | Tulintseff | .................... 333/238 |
| 6,184,478 | B1 | * | 2/2001 | Imano et al. | ................. 174/261 |
| 6,366,466 | B1 | * | 4/2002 | Leddige et al. | .............. 361/760 |
| 6,538,538 | B2 | * | 3/2003 | Hreish et al. | ................. 333/246 |
| 6,555,914 | B1 | * | 4/2003 | Thurairajaratnam et al. | ............................ 257/773 |
| 6,639,155 | B1 | * | 10/2003 | Bupp et al. | ................... 174/260 |
| 6,778,043 | B2 | * | 8/2004 | Stoddard et al. | ............. 333/246 |
| 6,828,513 | B2 | * | 12/2004 | Kistner | ........................ 174/261 |
| 6,969,808 | B2 | * | 11/2005 | Shiraki | ......................... 174/255 |
| 2002/0036099 | A1 | * | 3/2002 | Hachiya | ...................... 174/255 |

FOREIGN PATENT DOCUMENTS

| JP | 5-29772 | 2/1993 |
| JP | 2003-273525 | 9/2003 |
| JP | 02003309378 A | * 10/2003 |

* cited by examiner

*Primary Examiner*—Ishwar (I. B.) Patel
(74) *Attorney, Agent, or Firm*—Birch, Stewart, Kolasch & Birch, LLP

(57) ABSTRACT

A circuit board with mounting pads is described for improving the frequency response of routing traces. The present invention is used to etch an etching hole on ground layer corresponding to the surface-mounted devices (SMD) on a routing layer and therefore the parasitic effect from the stray capacitor is reduced, resulting in eliminating the parasitic effect in high-frequency and raising the quality of the PCB as well.

20 Claims, 6 Drawing Sheets

CIRCUIT BOARD WITH MOUNTING PADS FOR REDUCING PARASITIC EFFECT

This Nonprovisional application claims priority under 35 U.S.C. § 119(a) on Patent Application No(s). 093103818 filed in Taiwan, Republic of China on Feb. 17, 2004, the entire contents of which are hereby incorporated by reference.

BACKGROUND OF THE INVENTION

1. Field of the Invention

The present invention is used to eliminate the parasitic effect of the circuit board with mounting pads by etching the area on the ground plane corresponding to the surface-mounted devices on a routing layer for increasing the response of routing traces and raising the quality of the circuit board.

2. Description of Related Art

Since the advancement of IC technique, the required wiring pins are getting more complicated and the more routing traces are needed oppositely. Therefore, the design of a PCB is getting more complicated and integrated due to the area spared and multi-layer design of the PCB.

The method for manufacturing the conventional PCB is to press a plurality of layers with different functions, including at least a power plane, an element layer, a signal layer, a ground plane and some interposed insulator layers. Since the distance of separation ground plane and the routing layer is narrow, the parasitic effect of mounting pads is brought out and exceeds the original design of the PCB.

FIG. 1 shows a schematic drawing of a multi-layer PCB with a routing layer 11 and ground plane 13 in the prior art, wherein the conducting line 12 and the mounting pad 14 connected with are formed on the routing layer 11. The mounting pad 14 is used to solder the surface-mounted device (SMD) 16 above the routing layer 11. The mounting pad 14 can be the place of a lead terminal or connector of probe needle, which has a larger region than the conductive line 12. In the drawing, there is a ground plane 13 next to the routing layer 11 as an electrical reference.

In high-frequency circuit, the printed circuit board with the scale of mil should be designed to prevent the response degradation of multi-layer board. The degradation occurring is like the metal mounting pads due to a tiny distance between ground plane 13 and routing layer 11. The parasitic effect appearing between the layers will degrade the performance and frequency response of the PCB, especially in the region of surface-mounted device 16 as shown in FIG. 1.

FIG. 2 is the diagram of curves of the parasitic capacitor from the mounting pads in high-frequency circuit. The curve 21 and the curve 23 respectively show the capacitor effect while the distance between the routing layer 11 and the ground plane 13 is 4 mils and 12 mils. Thus, the capacitance shown on curve 21 is larger than the value shown on curve 23; therefore, the parasitic effect should be considered as the devices on PCB are thinner and smaller.

For improving the demerit of the prior art, in which a severe parasitic effect occurs between the layers in current PCBs because the width of a PCB is too narrow, the present invention provides a ground plane with at least one etching hole etched therein and corresponding to SMD on the routing layer.

SUMMARY OF THE DISCLOSURE

The present invention is to provide a circuit board with mounting pads for reducing parasitic effect. The present invention comprises at least one mounting pad located on a first conductive layer of the circuit board and used to carry a terminal of a surface-mounted device, and at least one etching hole located in a second conductive layer of the circuit board and corresponding to the mounting pad on the first conductive layer. Therefore, the parasitic effect from the stray capacitor is reduced, resulting in eliminating the parasitic effect in high frequency and raising the quality of the PCB as well.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF DRAWINGS

The present invention will become more fully understood from the detailed description given hereinbelow and the accompanying drawings, which are given by way of illustration only, and thus are not limitative of the present invention, and in which.

DETAILED DESCRIPTION OF THE PREFERRED EMBODIMENTS

The main purpose of the present invention is to provide a circuit board with mounting pads for minimizing parasitic effect and raising the frequency response.

Figure 1:
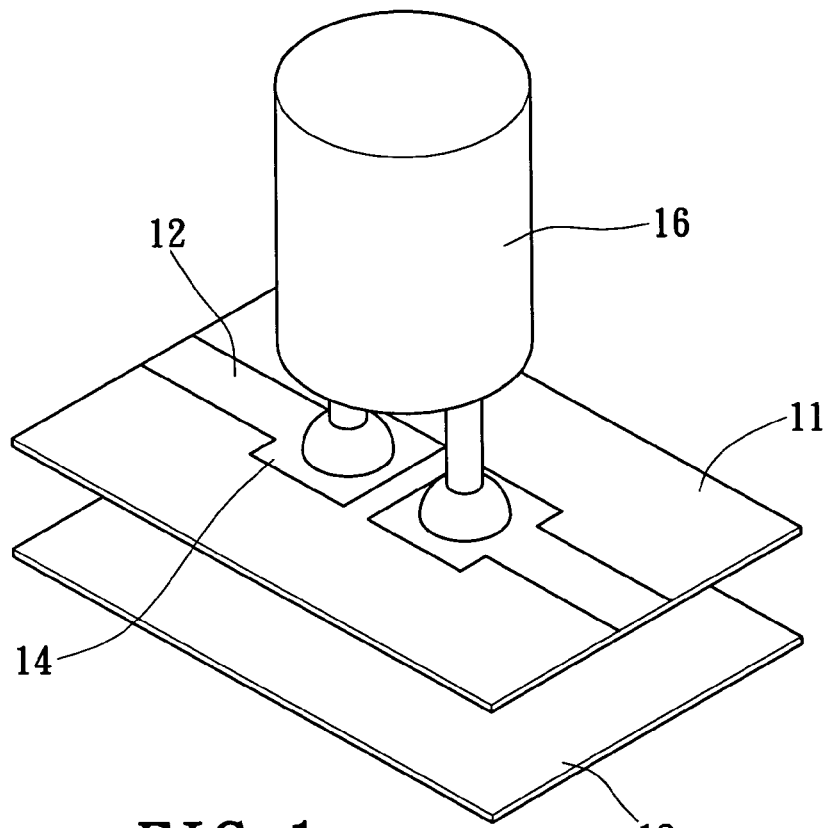
FIG. 1 is a schematic drawing of a mounting pad on a multi-layer PCB with a routing layer and a ground layer of the prior art.
Figure 2:
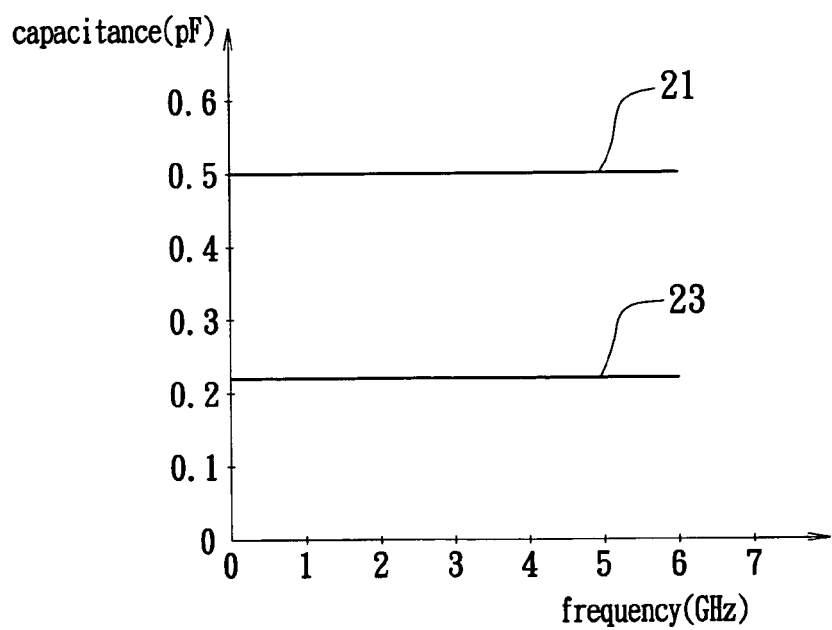
FIG. 2 is a schematic diagram of curves of the capacitance of the mounting pad of the prior art.
Figure 3A:
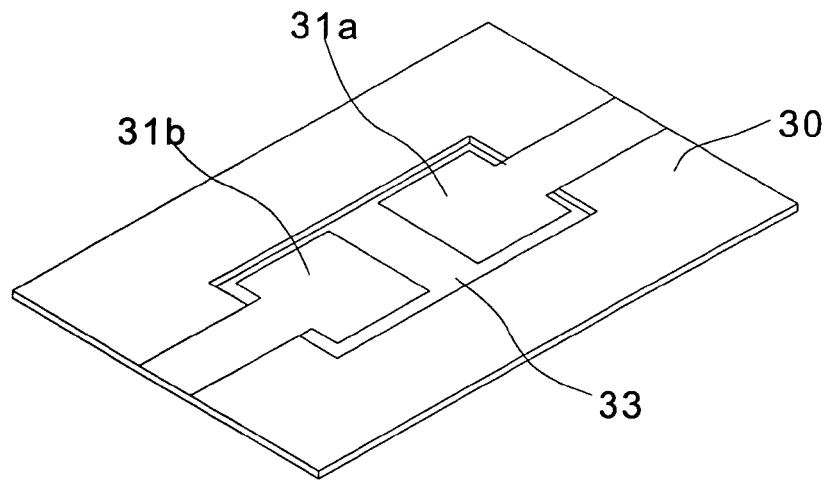
FIG. 3A is a schematic drawing of the first embodiment of the present invention.

FIG. 3A is the schematic drawing of the first embodiment of the present invention, which shows a first mounting pad 31a and a second mounting pad 31b, but these are not limiting the implementation of the present invention. The mounting pads 31a and 31b are located on first layer of the PCB, and the second ground plane 30 is next to one side of the first plane. For preventing a stray capacitor from occurring between the mounting pads 31a, 31b and second layer 30 and affecting the response of SMD, an etching hole 33 is etched in the second plane 30 corresponding to the area of the first mounting pad 31a and second mounting pad 31b. The etching hole 33 overlaps the above mounting pads 31a, 31b completely, and can be used to eliminate the stray effect between the mounting pad itself and its edge and the second plane 30.

Figure 3B:
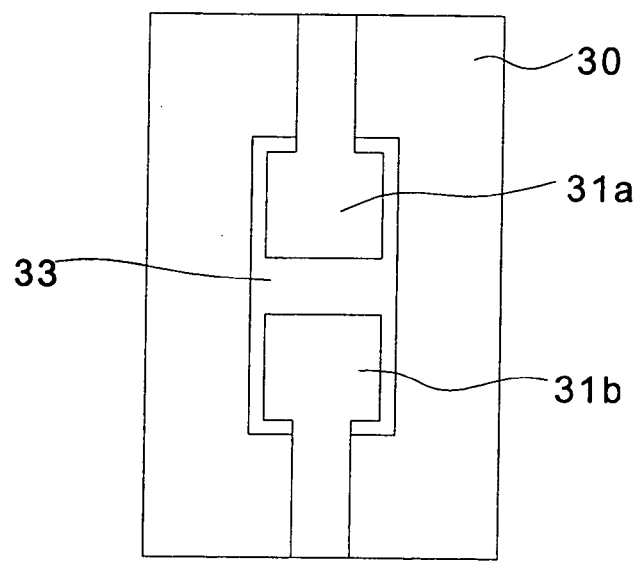
FIG. 3B is a schematic drawing of a top view of the first embodiment of the present invention.

FIG. 3B shows the top view of the first embodiment, and discloses that the etching hole 33 formed on the second plane 30 overlaps the first mounting pad 31a and mounting pad 31b of the first layer and eliminates the stray effect between the mounting pads 31a, 31b and the second plane 30.

The etching hole 33 described in first embodiment is bigger than the area of the mounting pads 31a, 31b, so that the edge stray effect between the mounting pads 31a, 31b and second plane 30 can be eliminated. But in actual implementation, some of the following situation will be shown: 1. the etching hole is the same as the corresponding area of mounting pads; 2. the etching hole completely or partially overlaps the mounting pads; 3. the etching hole completely or partially overlaps the edge of the mounting pads; 4. the etching hole completely or partially overlaps the comers of the mounting pads; 5. the etching hole completely or partially overlaps the area between the mounting pads; and 6. the etching hole can be any shape in the embodiment. Reference is made to the following detailed descriptions regarding other embodiments.

Figure 4:
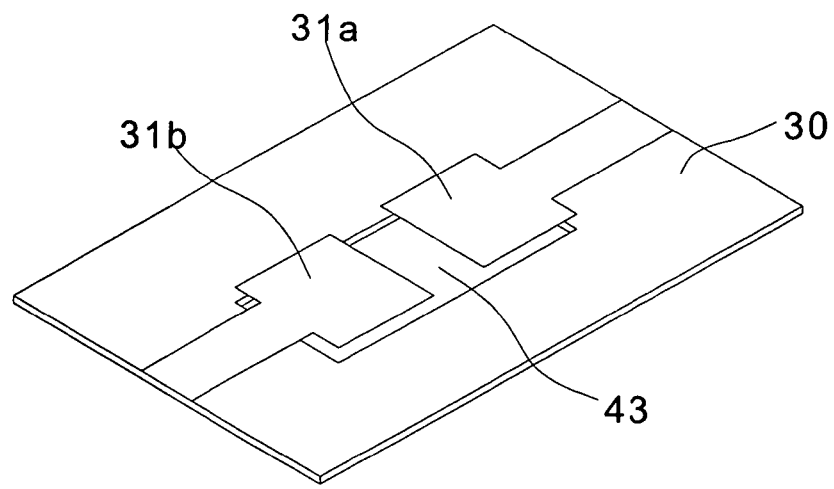
FIG. 4 is a schematic drawing of the second embodiment of the present invention.

FIG. 4 is a schematic drawing of the second embodiment of the present invention and shows that the area of etching hole 43 etched in the second plane 30 overlaps the area of the first mounting pad 31a and second mounting pad 31b of the first layer and also overlaps the area between the two pads in the first layer properly. Briefly, the etching hole 43 is formed for eliminating the stray effect between the mounting pads 31a, 31b and the ground plane 30.

Figure 5:
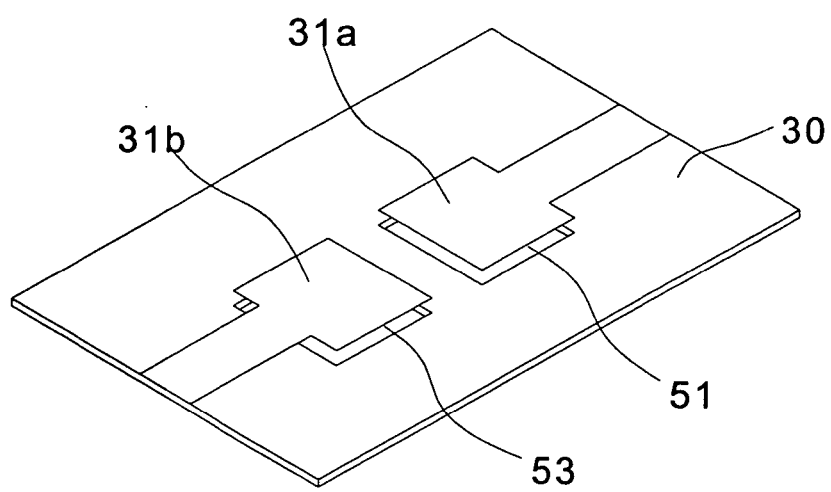
FIG. 5 is a schematic drawing of the third embodiment of the mounting pad of the present invention.

FIG. 5 shows the third embodiment of the present invention without the edge effect occurring, probably from the mounting pads, in which the etching holes 51, 53 is the same as the corresponding area of the mounting pads 31a, 31b respectively.

Figure 6A:
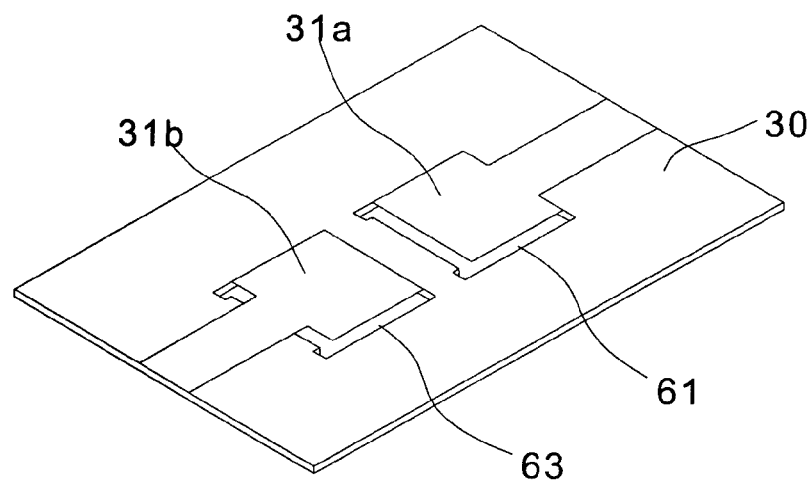
FIG. 6A is a schematic drawing of the fourth embodiment of the present invention.

FIG. 6A is a schematic drawing of the fourth embodiment of the present invention. This fourth embodiment shows that the H-shaped etching holes 61, 63 etched on the second plane 30 overlap the area of the first mounting pad 31a and the second mounting pad 31b and further overlap the corners of the these mounting pads of the first layer. The parasitic effect occurring between the mounting pads 31a, 31b and the ground plane 30 can be eliminated, and the edge stray effect formed at comers of the mounting pads due to the fringing electric field occurring at metal tips can be further reduced.

Figure 6B:
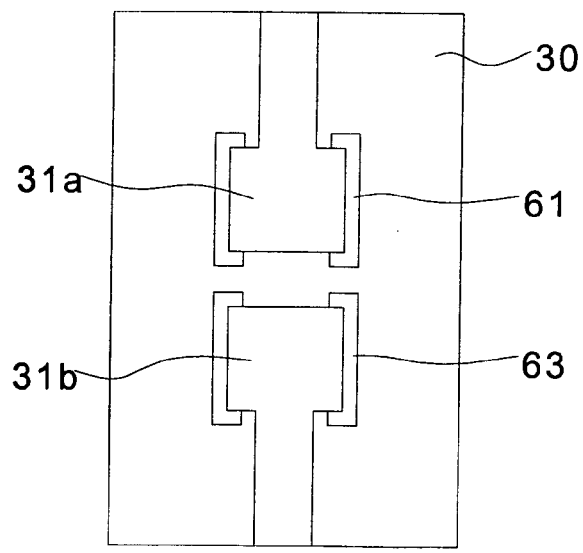
FIG. 6B is a schematic drawing of a top view of the fourth embodiment of the present invention.

Reference is made to FIG. 6B, an illustration of a top view of the fourth embodiment. Apparently, for eliminating the parasitic effect between the first layer and the second plane 30 efficiently, the corners of the mounting pads are also overlapped by the etching holes 61, 63.

Figure 7:
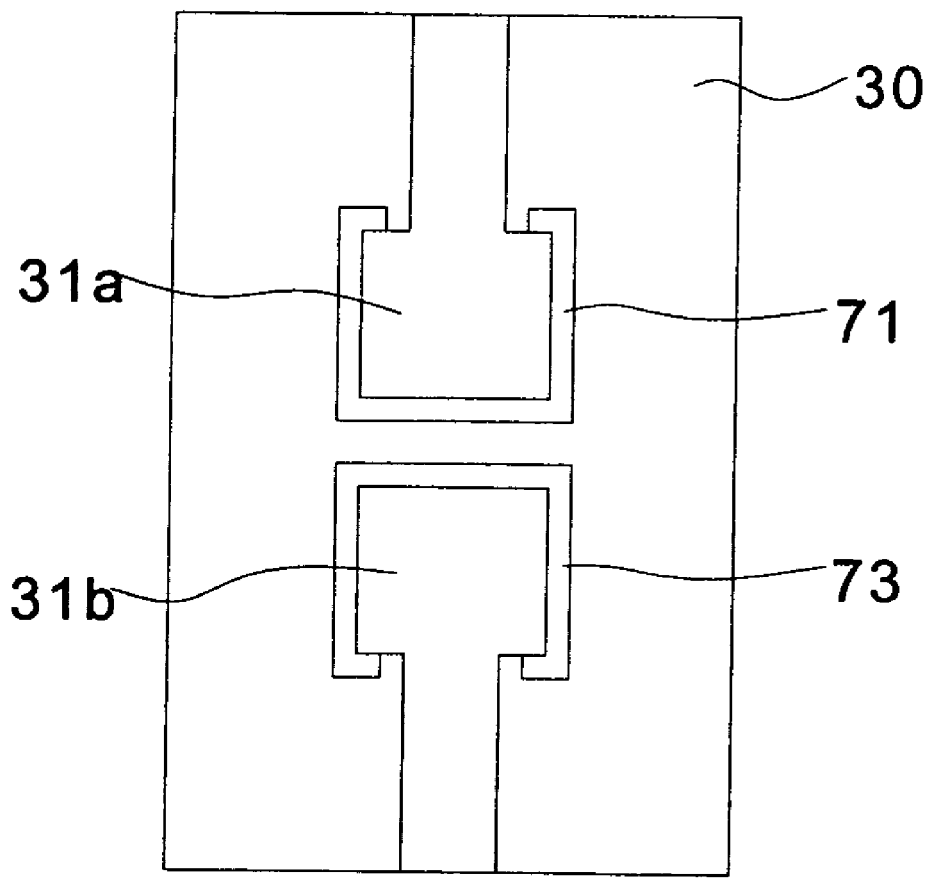
FIG. 7 is a schematic drawing of a top view of the fifth embodiment of the present invention.
Figure 8A:
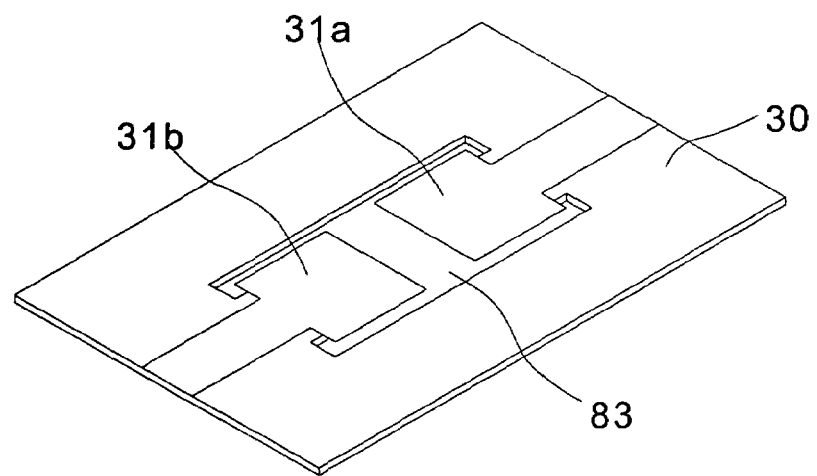
FIG. 8A is a schematic drawing of the sixth embodiment of the present invention.

FIG. 7 is the fifth embodiment of the present invention. The etching holes 71, 73 entirely cover the area of the first mounting pad 31a and the second mounting pad 31b, respectively, and even expand the edge area of the etching holes 71, 73 for eliminating the edge-fringing effect between the mounting pads 31a, 31b and the second plane 30 further. FIG. 8A shows the sixth embodiment of the present invention. The etching hole 83 etched on the second plane 30 overlaps entirely the area of the mounting pads 31a, 31b, and even overlaps the edge corresponding to the two pads and the part between the two pads.

Figure 8B:
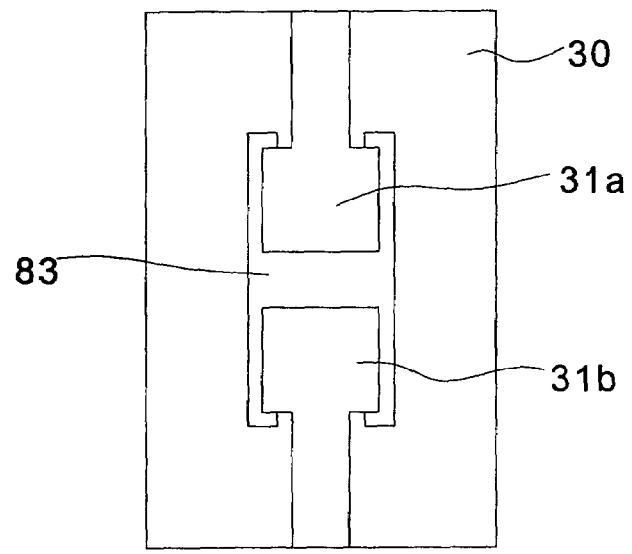
FIG. 8B is a schematic drawing of a top view of the sixth embodiment of the present invention.

FIG. 8B further shows the top view of the sixth embodiment of the present invention. The etching hole 83 completely overlaps the area of the first mounting pad 31a and the second mounting pad 31b, and even the area corresponding to the part between the two mounting pads and the edge thereon.

The etching hole described in best implementation above of the present invention, which relates to a circuit board with mounting pads for reducing parasitic effect, can be implemented as any shape, and can be arranged as any requirement.

The many features and advantages of the present invention are apparent from the written description above and it is intended by the appended claims to cover all. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A circuit board with mounting pads for reducing parasitic effect, comprising:
   at least one mounting pad, located on a first conductive layer of said circuit board and used to carry a terminal of a surface-mounted device; and
   at least one etching hole, located in a second conductive layer of said circuit board and corresponding to said mounting pad, wherein the mounting pad is in a rectangular shape and the etching hole is H-shaped to surround a corner of the mounting pad,
   wherein the mounting pad has a projected area on the second conductive layer, and the area of the etching hole covers the projected area.

2. A circuit board with mounting pads as recited in claim 1, wherein said second conductive layer is adjacent to said first conductive layer.

3. A circuit board with mounting pads as recited in claim 1, wherein said second conductive layer can be a ground plane.

4. A circuit board with mounting pads as recited in claim 1, wherein said second conductive layer can be a power plane.

5. A circuit board with mounting pads as recited in claim 1, wherein the area of said etching bole is the same as the area of said mounting pad.

6. A circuit board with mounting pads as recited in claim 1, wherein said etching hale at least partially overlaps said mounting pad.

7. A circuit board with mounting pads as recited in claim 1, wherein said etching hole at least partially overlaps an edge of said mounting pad.

8. A circuit board with mounting pads as recited in claim 1, wherein said etching hole at least partially overlaps corners of said mounting pad.

9. A circuit board with mounting pads as recited in claim 1, wherein said etching hole is larger than said mounting pads.

10. A circuit board with mounting pads as recited in claim 1, wherein said circuit board is disposed in a chip package structure.

11. A circuit board with mounting pads as recited in claim 1, further comprising at least one insulator layer disposed interposed between the first conductive layer pad and the second conductive layer, wherein the mounting pad insulating from the etching hole by the insulator layer.

12. A circuit board with a plurality of mounting pads for reducing parasitic effect, comprising:

at least one set of mounting pads, located on a first conductive layer of said circuit board and used to carry a set of terminals of a surface-mounted device, wherein the set of mounting pads is in a rectangular shape; and at least one etching hole, located in a second conductive layer of said circuit board and corresponding to said set of mounting pads, wherein each etching hole is H-shaped to surround a corner of each set of mounting pads, wherein each at least one set of mounting pads has a projected area on the second conductive layer, and the area of each at least one etching hole covers the projected area.

13. A circuit board with a plurality of mounting pads as recited in claim 12, wherein said second conductive layer is adjacent to said first conductive layer.

14. A circuit board with a plurality of mounting pads as recited in claim 12, wherein said second conductive layer can be a ground plane.

15. A circuit board with a plurality of mounting pads as recited in claim 12, wherein said second conductive layer can be a power plane.

16. A circuit board with a plurality of mounting pads as recited in claim 12, wherein said etching hole at least partially overlaps said mounting pads.

17. A circuit board with a plurality of mounting pads as recited in claim 12, wherein said etching hole at least partially overlaps an edge of said mounting pads.

18. A circuit board with a plurality of mounting pads as recited in claim 12, wherein said etching hole at least partially overlaps corners of said mounting pads.

19. A circuit board with a plurality of mounting pads as recited in claim 12 wherein said circuit board is disposed in a chip package structure.

20. A circuit board with mounting pads as recited in claim 12, further comprising at least one insulator layer disposed interposed between the first conductive layer pad and the second conductive layer, wherein the mounting pad insulating from the etching hole by the insulator layer.

\* \* \* \* \*